US006238218B1

(12) United States Patent
Baffert

(10) Patent No.: US 6,238,218 B1
(45) Date of Patent: May 29, 2001

(54) DEVICE FOR ELECTRICALLY CONNECTING A COAXIAL LINE TO A PRINTED CIRCUIT CARD

(75) Inventor: Jean-Marc Baffert, Charavines (FR)

(73) Assignee: Radiall, Rosny-Sous-Bois (FR)

( * ) Notice: Subject to any disclaimer, the term of this patent is extended or adjusted under 35 U.S.C. 154(b) by 0 days.

(21) Appl. No.: 09/572,262

(22) Filed: May 17, 2000

(30) Foreign Application Priority Data

May 20, 1999 (FR) .................................................. 99 06400

(51) Int. Cl.[7] .............................. H01R 12/00; H05K 1/00
(52) U.S. Cl. ................................................ 439/63; 439/581
(58) Field of Search ................................ 439/63, 581, 79, 439/80

(56) References Cited

U.S. PATENT DOCUMENTS

| | | | |
|---|---|---|---|
| 3,426,311 * | 2/1969 | Gifford | 439/63 |
| 3,539,966 * | 11/1970 | Logan | 439/63 |
| 4,737,111 * | 4/1988 | Minar et al. | 439/63 |
| 5,405,267 | 4/1995 | Koegel et al. . | |
| 6,065,976 * | 5/2000 | Wang | 439/63 |

FOREIGN PATENT DOCUMENTS

| | | |
|---|---|---|
| 86 16 081 | 8/1991 | (DE) . |
| 197 53 839 | 4/1999 | (DE) . |
| 0 915 536 | 5/1999 | (EP) . |

* cited by examiner

*Primary Examiner*—Brian Sircus
*Assistant Examiner*—Brian S. Webb
(74) *Attorney, Agent, or Firm*—Schweitzer Cornman Gross & Bondell LLP

(57) ABSTRACT

The invention relates to a device for electrically connecting a coaxial line to a printed circuit card having at least two conductor tracks each extending to an edge of said card. The device has an outer contact and a center contact received inside the outer contact. The outer contact has a portion for connection to the card that is substantially tubular in shape, being provided with two diametrically-opposite slots which subdivide said connection portion into two jaws arranged to pinch between them said card inserted via its edge between said jaws, and the center contact has portion for connection to the card in the form of a clip into which the edge of the card is engaged when the card is inserted between the two jaws of the outer contact.

5 Claims, 9 Drawing Sheets

DEVICE FOR ELECTRICALLY CONNECTING A COAXIAL LINE TO A PRINTED CIRCUIT CARD

The present invention relates to a device for electrically connecting a coaxial line to a printed circuit card.

BACKGROUND OF THE INVENTION

Various solutions have already been devised and proposed for connecting a coaxial cable to a printed circuit card.

The simplest solution consists in soldering the ground conductor and the central conductor of the cable directly to corresponding tracks on the card. Nevertheless, that method is suitable for circuits that operate at low frequency only because of the poor impedance matching that results from the soldering. It also does not enable the cable to be disconnected.

Connectors have also been proposed that comprise two elements, one of which is fixed to the card and the other of which is mounted on the end of the coaxial cable. Such connectors present all of the advantages of a releasable connection, and they generally provide good impedance matching for the line.

However they are relatively complex and expensive to manufacture and they occupy considerable volume on the card, and that is not always compatible with miniaturizing the card.

OBJECTS AND SUMMARY OF THE INVENTION

The invention seeks to provide a device which is simple and of low cost but enables a coaxial line to be connected directly to a printed circuit card, the device also being very small in volume.

The present invention provides a device for electrically connecting a coaxial line to a printed circuit card having at least two conductor tracks each extending to the edge of said card, the device comprising an outer contact and a center contact housed inside the outer contact, wherein the outer contact has a substantially tubular connection portion for connection to the card, said connection portion having two diametrically-opposite slots subdividing it into two jaws arranged to pinch between them said card inserted via its edge between said jaws, and wherein the center contact comprises a clip-forming connection portion for connection to the card, with the edge of the card engaging therein when the card is inserted between the two jaws of the outer contact.

The device of the invention turns out to be particularly simple and of low cost to manufacture and to install since it is made up of only one element which is mounted directly on the card.

To use the device of the invention, it suffices to organize the tracks for connection at the edge of the card by spacing them so that they come into register with the bearing zones of the contacts of the device.

It is not necessary for all of these bearing zones of the contacts, which are the ends whereby said contacts pinch the card, to make an electrical connection between the contact concerned and a track of the card, some of them need only perform the mechanical function of pinching the card.

By means of the invention, the coaxial structure of the electric line is conserved all the way to the tracks on the card, thereby providing better impedance matching with the line.

With respect to the card, the device of the invention also presents the advantage whereby no special preparation is required for the card other than arranging the conductor tracks at the edge of the card, i.e. there is no need for any cutting, metallization, or drilling.

In a particular embodiment of the invention, the outer contact of the device is made on a lathe.

In another embodiment, the outer contact is made by cutting and rolling a metal sheet.

In a particular embodiment, the center contact is made by cutting, rolling, and/or folding a metal sheet.

In a particular embodiment, the device is arranged to be mounted on a panel adjacent to the printed circuit card, in such a manner that said panel supports the device and releases its connection portion mounted on the edge of the card from the mechanical stresses that result from the presence of a coaxial cable.

BRIEF DESCRIPTION OF THE DRAWINGS

In order to make the invention better understood, there follows a description of two embodiments given as non-limiting examples of the scope of the invention and made with reference to the accompanying drawings, in which.

MORE DETAILED DESCRIPTION

Figure 1:
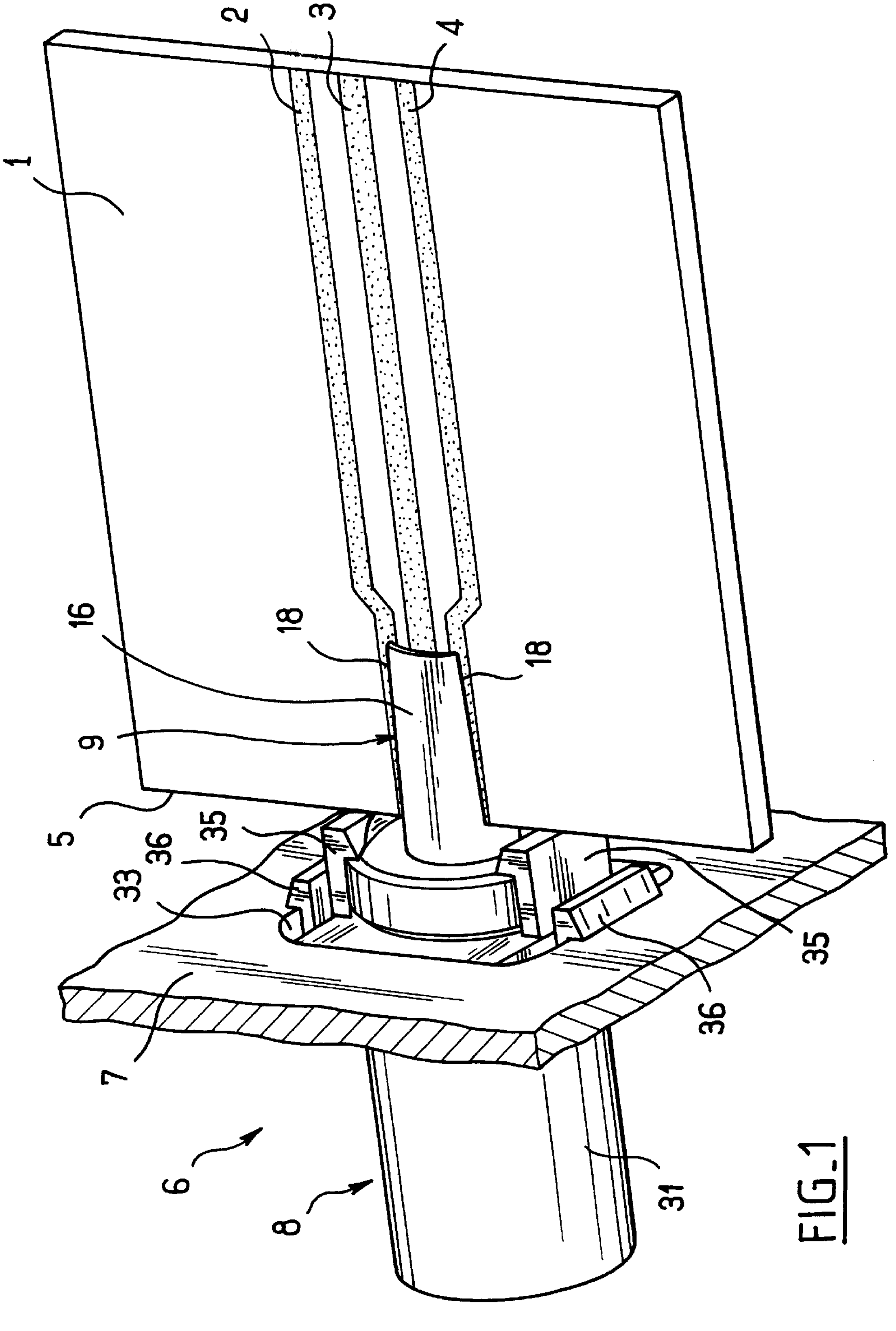
FIG. 1 is a perspective view of a portion of a printed circuit card and a device constituting a first embodiment of the invention.

In FIGS. 1 to 8, there can be seen a printed circuit card 1 having a ribbon of three parallel conductor tracks 2, 3, 4, where the center track 3 is designed to convey an electrical signal while the tracks 2 and 4 on either side thereof are ground tracks.

The spacing between the tracks on the card is determined as a function of the impedance that is to be given to the pseudo-coaxial line they constitute.

The three tracks extend to the edge 5 of the card where they are brought closer together so that their spacing corresponds to the spacing of the connection device 6 described below.

The connection device 6 is mounted on a panel 7 (shown in part) of a housing (not shown) containing the card.

The device comprises a body 8, an outer contact 9, an insulator 10, and a center contact 11 housed inside the outer contact.

Figure 6:
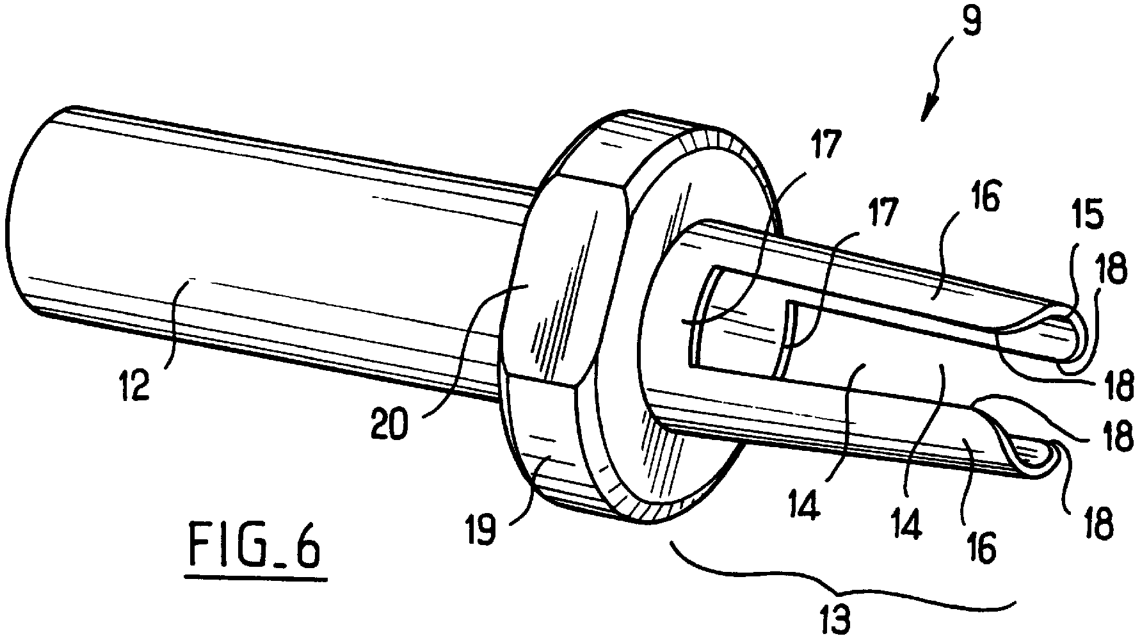
FIG. 6 is a perspective view of the outer contact.

In FIG. 6, the outer contact can be seen to comprise a tubular rear portion 12 for connecting electrically to the ground contact of a coaxial connector element (not shown) to which the device is to be connected, and a front portion 13 which is referred to as the connection portion, which is substantially tubular in shape, and which has two diametrically opposite slots 14 extending all the way to the front face 15 of the contact, thus forming two facing jaws 16.

These two slots 14 allow the edge 5 of the card to be inserted between them, with the card then being pinched between the two jaws 16 of the outer contact.

Each slot 14 is trapezoidal in shape, having a large base 17 remote from the front face 15 of the contact.

Thus, when the outer contact 9 is engaged on the printed circuit card 1, each of the jaws 16 bears on the card via its front end which comprises two bearing zones 18 for engaging the ground tracks 2, 4 of the printed circuit card 1.

The rear portion 12 and the connection portion 13 of the contact are united by an annular collar 19 having two diametrically opposite flats 20.

Figure 7:
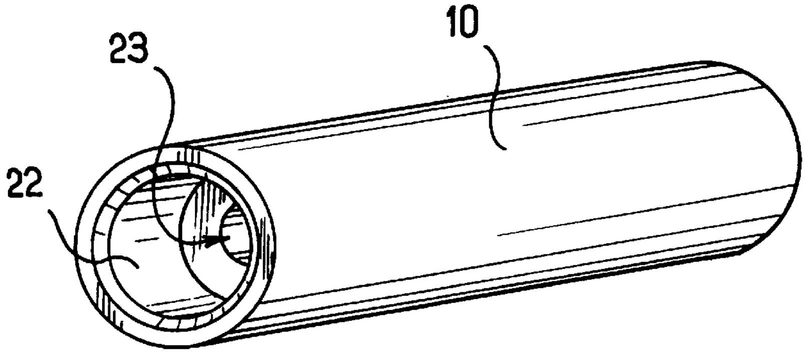
FIG. 7 is a perspective view of the insulation interposed between the center contact and the outer contact.
Figure 9:
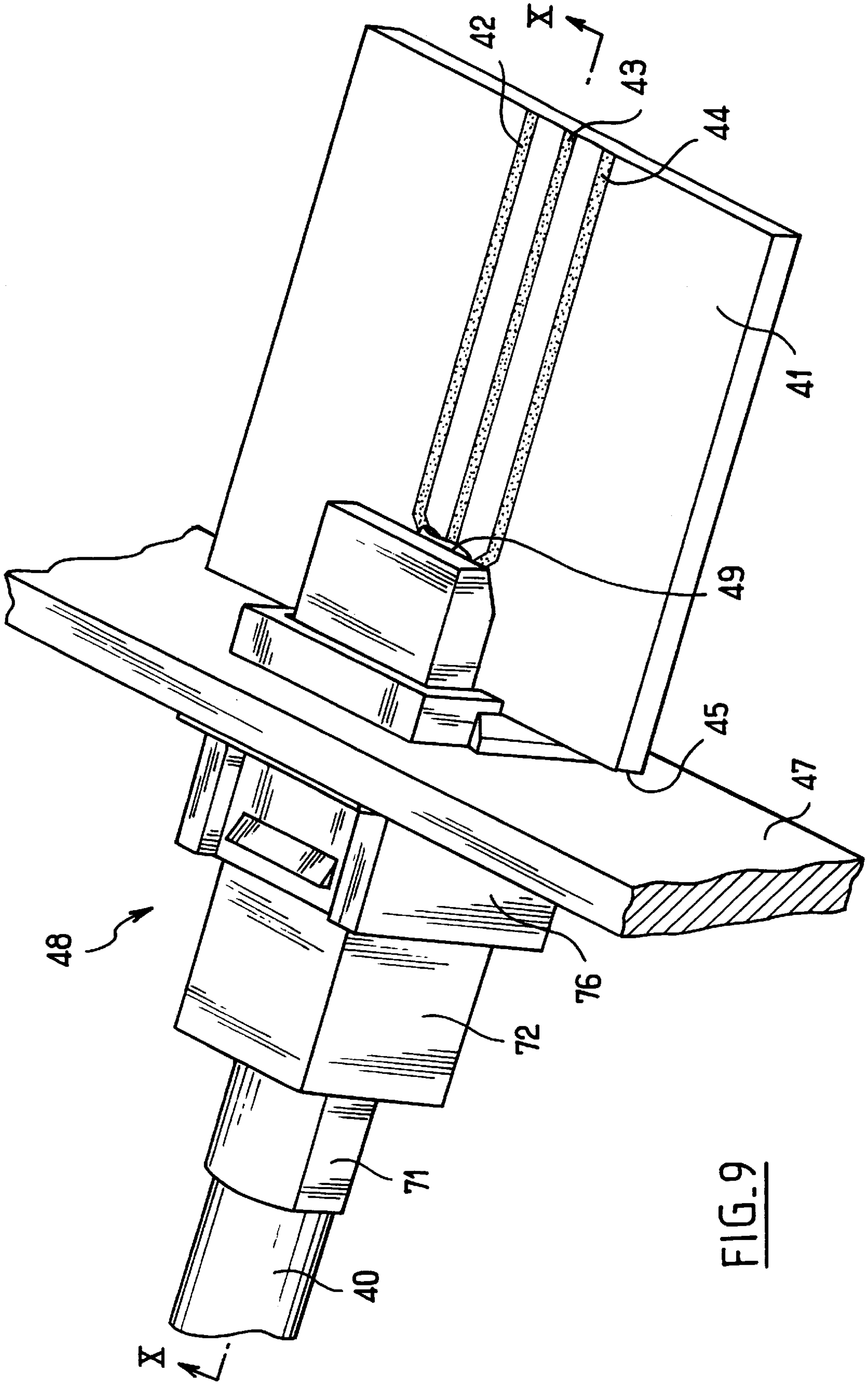
FIG. 9 is a perspective view of a device constituting a second embodiment of the invention.

Internally, the outer contact receives the tubular insulation 10, shown in particular in FIG. 7, which insulation has a front bore 21, a rear bore 22, and a longitudinal central channel 23 interconnecting the bores.

Figure 2:
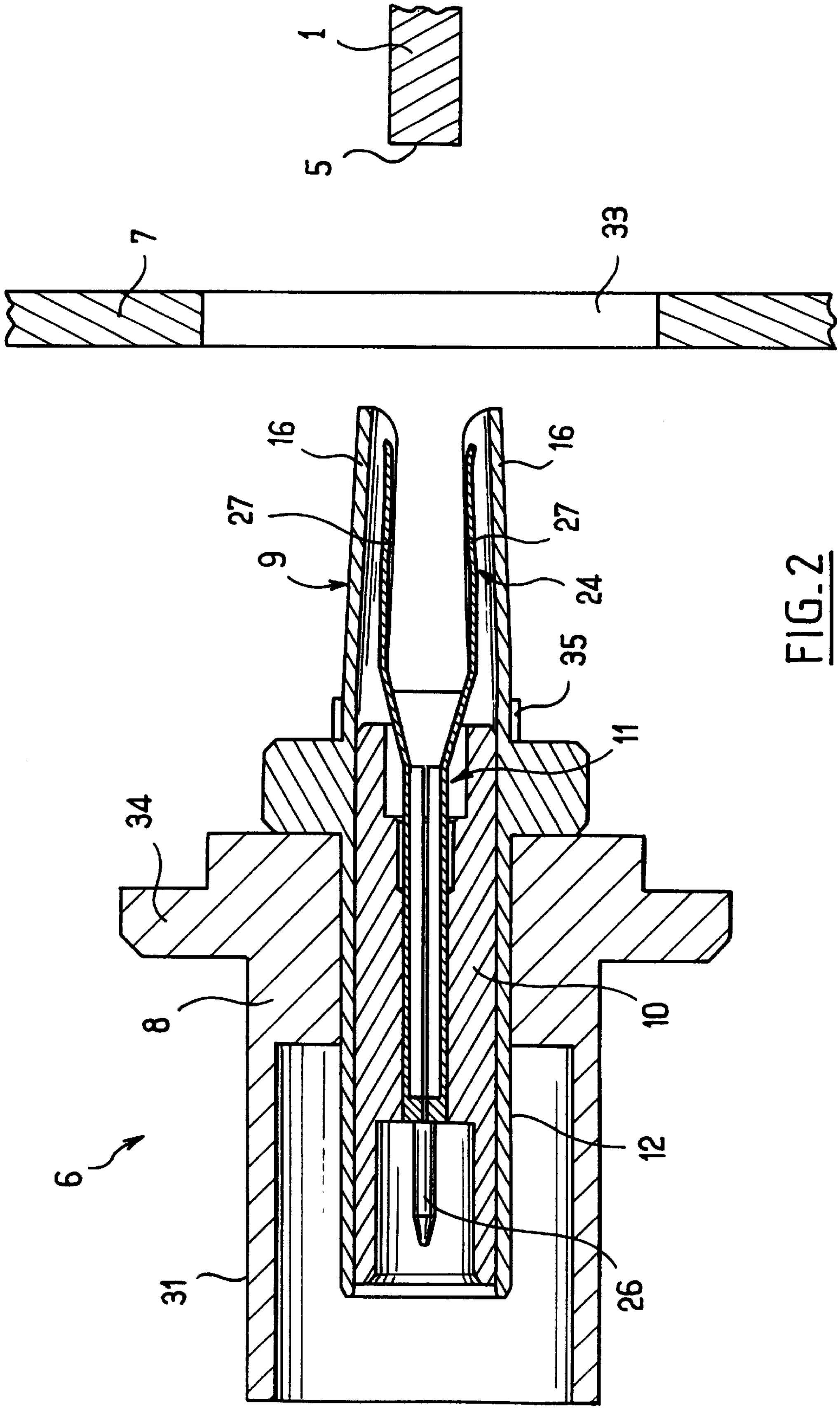
FIG. 2 is an axial section view of the FIG. 1 device, prior to being mounted on the card.
Figure 3:
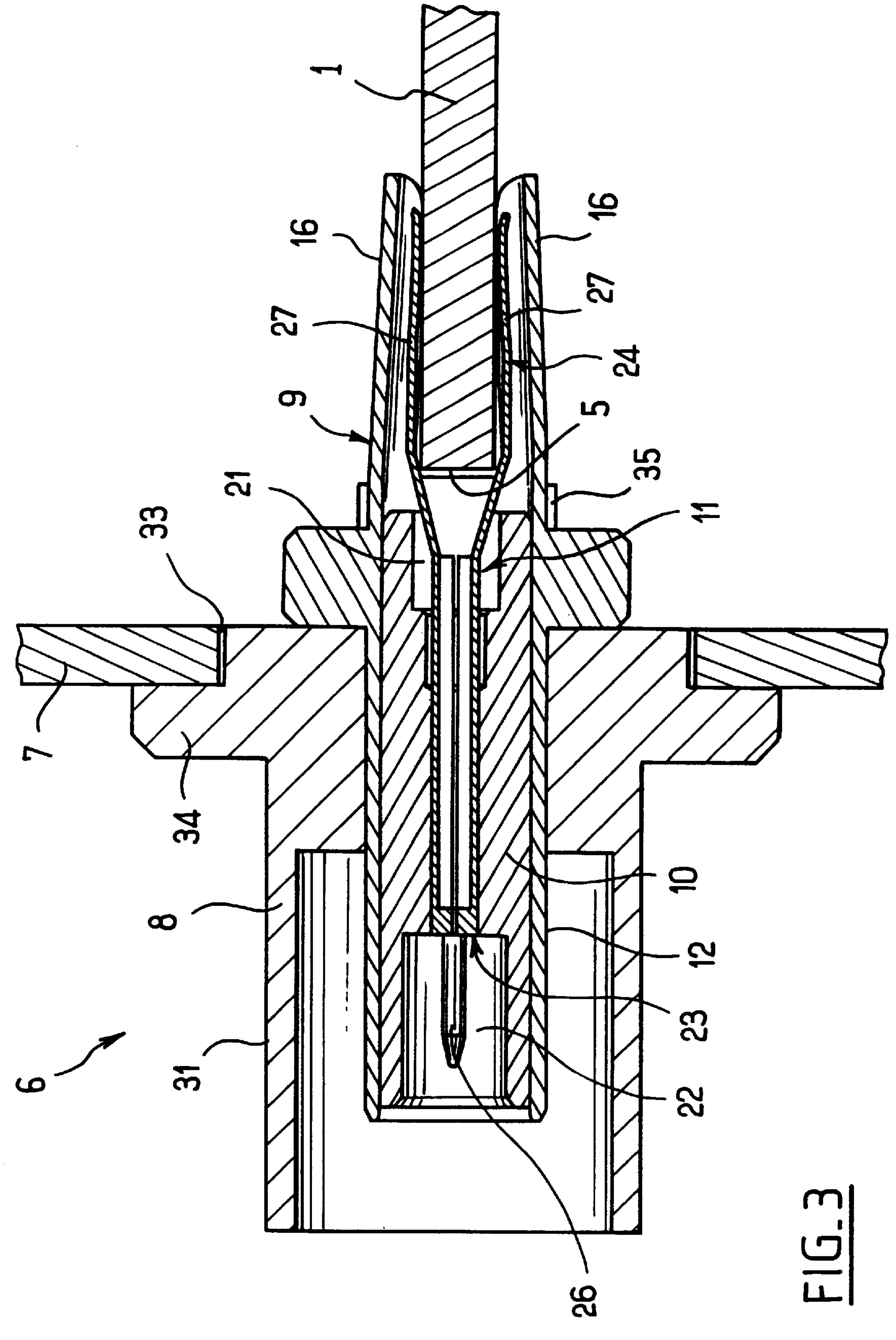
FIG. 3 is a view analogous to FIG. 2, showing the device after being mounted on the card.
Figure 8:
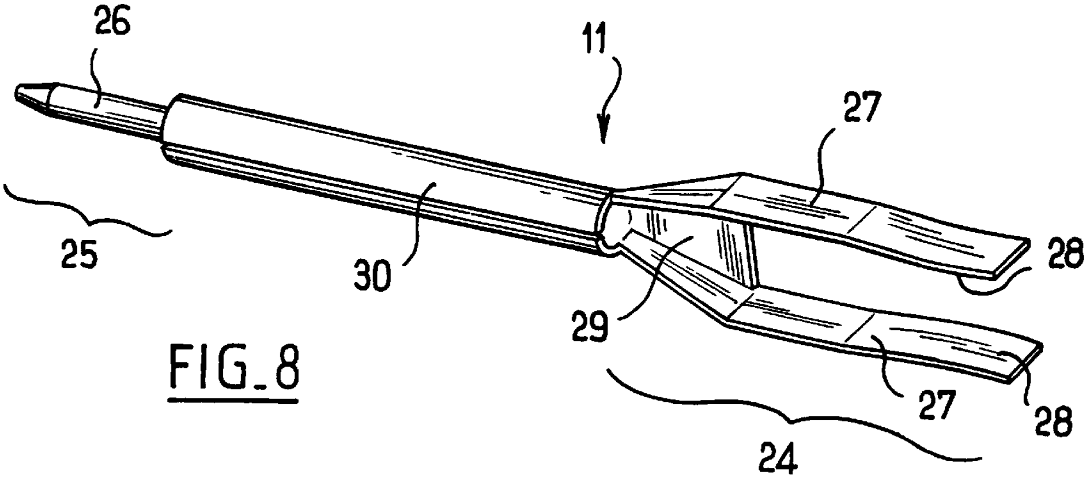
FIG. 8 is a perspective view of the center contact.

The center contact 11, shown in perspective in FIG. 8, is received in the insulation 10 as can be seen in particular in FIGS. 2 and 3.

The center contact has a front portion 24, referred to as a connection portion, in the form of a clip, and a rear portion 25 provided with a pin 26 designed to be connected to a socket of the central conductor of the coaxial connector element (not shown) to which the device is to be connected.

The bores 21 and 22 in the insulation 10 leave empty space around the clip 24 and around the pin 26.

The center contact is made by cutting and rolling a metal sheet onto the pin which is itself made on a lathe.

The connection portion 24 in the form of a clip comprises two spring blades 27 which between them define a lyre-shaped volume, in a manner that is well known for connection clips, so that the bearing zone 28 of each blade 27 against the printed circuit card 1 is located near the front end of the clip.

The two blades 27 are united by a web 29 which extends from their base ends to a cylindrical portion 30 of the conductor, serving to connect said blades 27 to the pin 26.

As can be seen in particular in FIG. 2, the center contact 10 is put into place inside the outer contact 9 with the tubular insulation 10 interposed between them, the center contact being oriented in such a manner that the two blades 27 of the clip 24 and the two jaws 16 of the outer contact leave between them a volume of thickness corresponding substantially to the thickness of the printed circuit card 1.

The center contact 11 is forced into the insulation 10 which is in turn forced into the outer contact 9.

Figure 4:
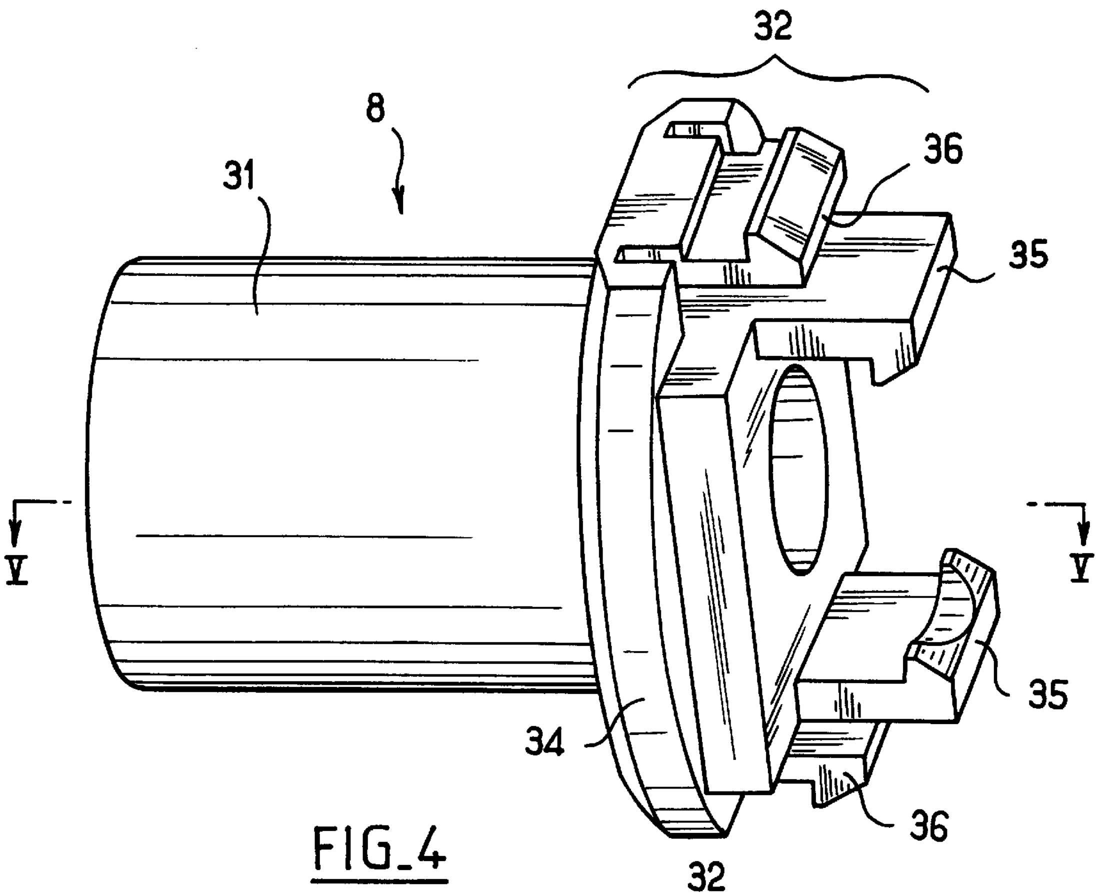
FIG. 4 is a perspective view of the body of the device.
Figure 5:
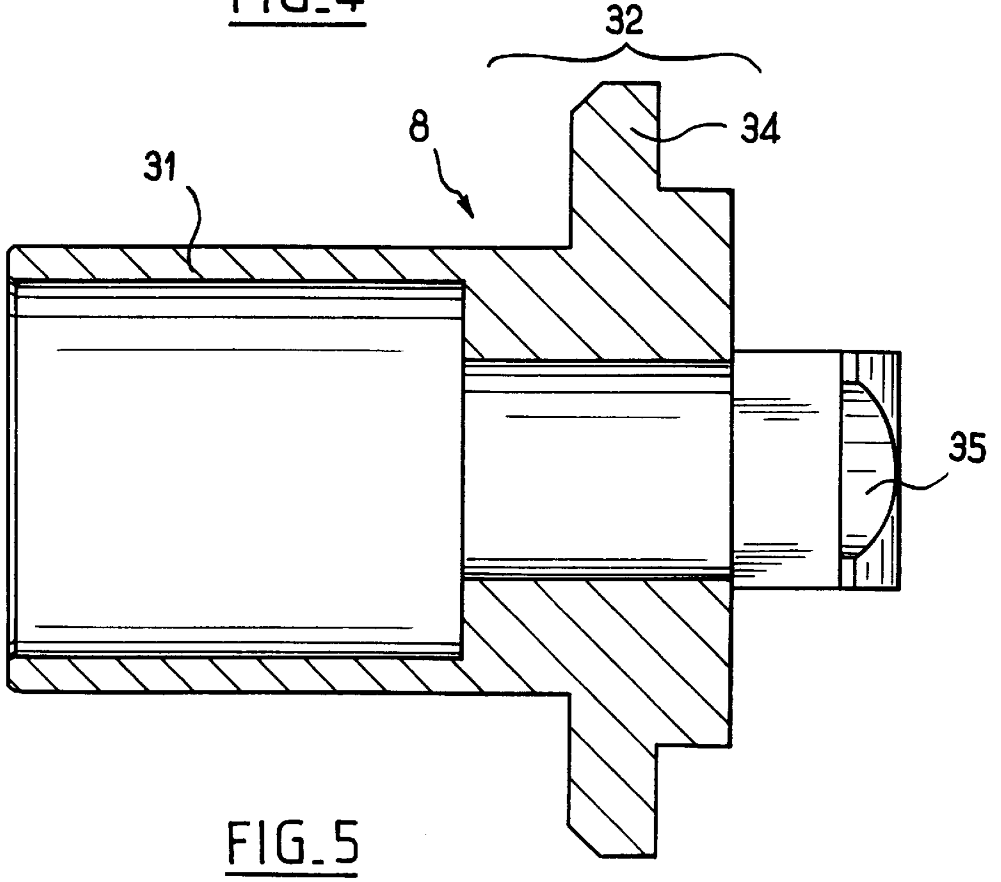
FIG. 5 is a section on V—V of FIG. 4.

The assembly comprising the two contacts and the insulation is inserted into the body 8 of plastic material that can be seen in FIGS. 4 and 5.

This body comprises a cylindrical rear portion 31 designed to receive internally the above-mentioned coaxial connector element that can be mounted on the end of a coaxial cable (not shown), and it also comprises a front portion 32 organized to ensure that the device is secured to the panel 7 through a hole 33 provided for this purpose.

The front portion 32 has a collar 34 of diameter greater than that of the hole 33 in the panel, and has two pairs of catches, a first pair 35 serving to hold the outer contact 9 to the body, and a second pair 36 serving to hold the body to the panel.

The inwardly-directed catches of the first pair 35 lock onto the collar 19 of the outer contact, bearing against its flats 20.

The catches of the second pair 36 are outwardly directed and serve to snap-fasten the body 8 to the panel in the position shown in FIG. 3.

In the embodiment of FIGS. 9 to 14, a coaxial cable 40 is likewise connected to ribbon of conductor tracks 42, 43, and 44 of a printed circuit card 41 whose edge 45 is situated close to a panel 47.

Figure 12:
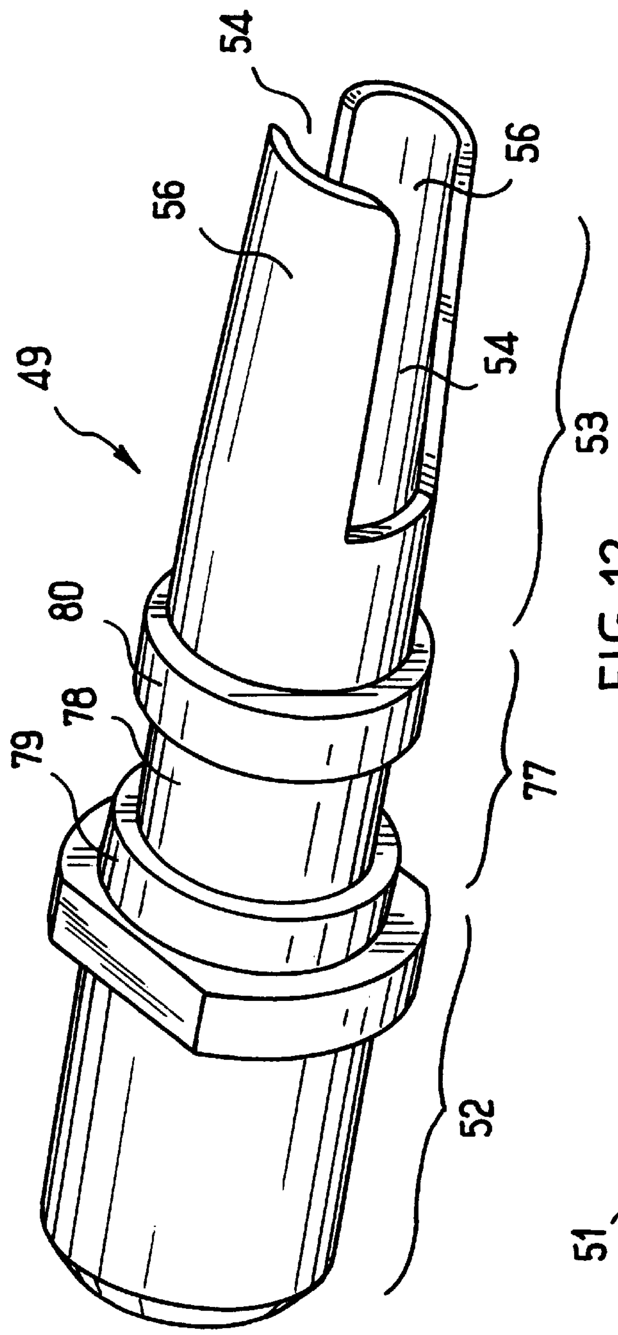
FIG. 12 is a perspective view of the outer contact.

As can be seen in FIG. 12, the outer contact 49 of the device has a rear portion 42 that receives the metal braid (not shown) of the coaxial cable 40, and has a front portion 43 for connection to the card and constituted by two jaws 56 separated by diametrically-opposite slots 54 and arranged to pinch the printed circuit card 1 so as to bear against the ground tracks 42 and 44.

Between the rear portion 52 and the front portion 53, the outer contact has an intermediate portion 77 constituted by a cylindrical segment 78 between two annular projections 79 and 80 whose function is described below.

Figure 14:
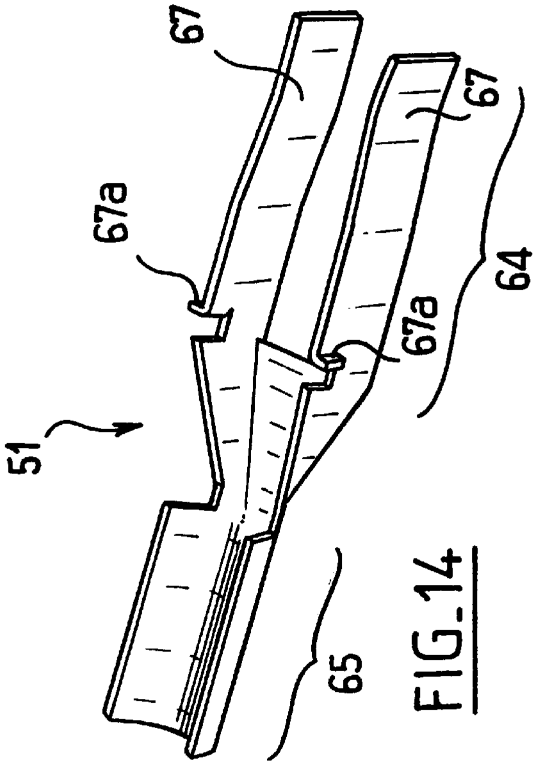
FIG. 14 is a perspective view of the center contact.

Inside the outer contact 49, there is received a center contact 51 which is shown in perspective in FIG. 14.

Figure 10:
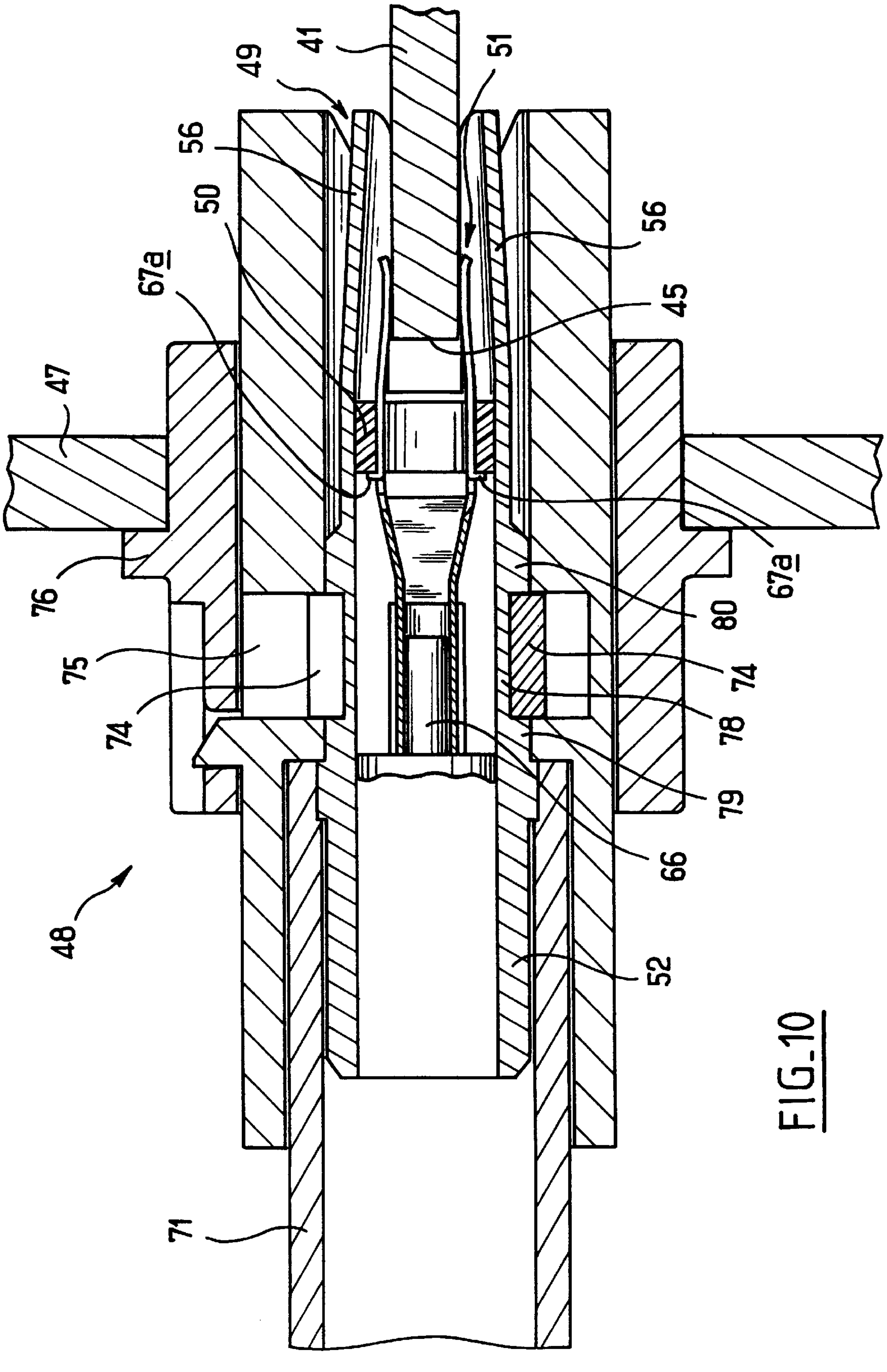
FIG. 10 is a section view on X—X of FIG. 9.

Like the contact described above, this center contact has a portion 64 in the form of a clip for connection to the card, this portion comprising two spring blades 67 given a lyre shape. The rear portion 65 of the center contact is constituted by a zone for crimping and is designed to be crimped onto the bare central conductor 66 of the coaxial cable (FIG. 10 shows only the central conductor, partially in section, and a leading portion of the insulation of the cable, as seen from the outside).

In its rear portion, the center contact 51 is centered inside the outer contact 49 by the cable itself, given that the central conductor of the coaxial cable is centered relative to the ground braid thereof.

Figure 13:
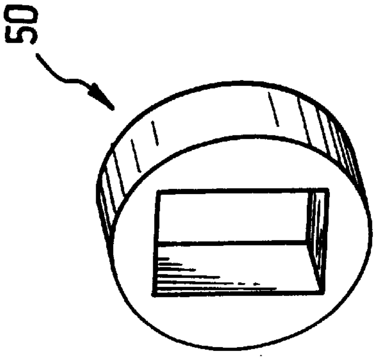
FIG. 13 is a perspective view of the insulation between the outer contact and the inner contact.

In its connection front portion 64, the center contact 51 is centered relative to the outer contact by interposed insulation 50 as shown in perspective in FIG. 13, which insulation is constituted by a segment of cylinder whose circular outer section corresponds to the inner section of the outer contact 49 and whose rectangular inner section corresponds to the greatest section of the center contact 51 in its segment where the two blades 67 are substantially parallel.

This insulation is engaged around the center contact from the front and it comes into abutment against two lugs 67*a* which project from the base of the clip.

Figure 11:
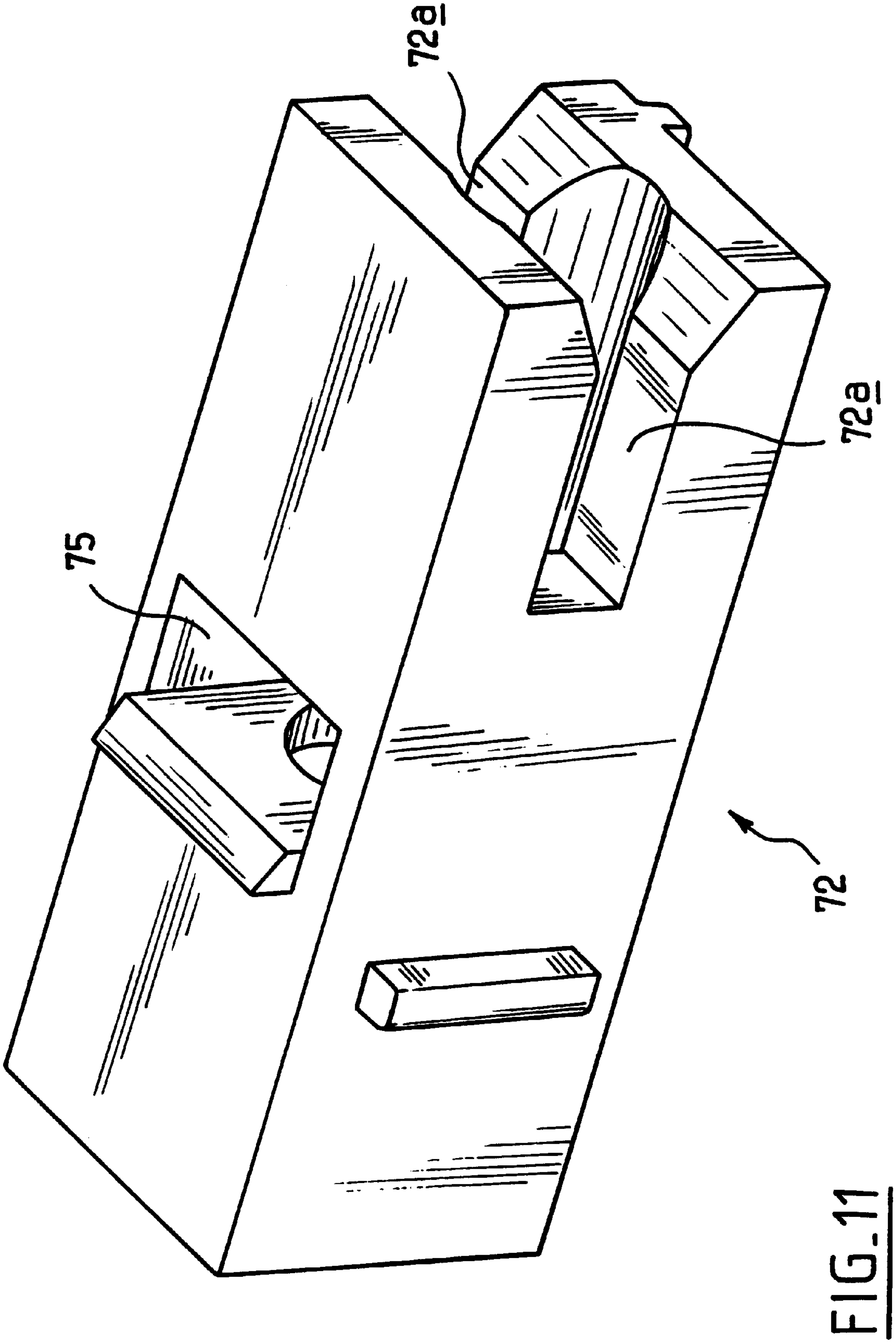
FIG. 11 is a perspective view of the body of the FIG. 9 device.

The assembly constituted by the outer contact 49, the insulation 50, and the center contact 51 is received in a three-piece housing 48 (FIG. 10) comprising: a rear sleeve 71 which engages around the cable 40 and compresses its metal braid against the rear portion 52 of the outer contact 49 by means of a force fit; a through portion 72 shown in perspective in FIG. 11 which receives the cable 40 fitted with the center contact 51 and the outer contact 49 and also with the rear sleeve 71, and which prevents it from moving axially by means of a split ring 74 engaged in a chimney 75 of said through portion and opening out in register with the cylindrical segment 77 of the outer contact between its two annular projections 79 and 80; and a fixing portion 76 which is snap-fastened to the panel 77 and which receives said through portion 72, closing its chimney 75 and holding it by snap-fastening.

The details whereby the through portion 72 is retained in the fixing portion 76 and whereby the fixing portion is retained in the panel 47 are not described herein since they are easily understood by the person skilled in the art who can devise numerous equivalents.

The through portion 72 covers the outer contact 49 over its entire length and, at its front, has two slots 72*a* corresponding to the slots 54 of the outer contact, thereby enabling the edge of the card to be inserted therein.

Such a device is assembled as follows.

The rear sleeve 71 of the housing is engaged on the cable 70 which has been stripped in such a manner as to cause its central conductor 66 to project by a length of a few millimeters.

The crimping zone 65 of the center contact is crimped onto the central conductor 66 of the cable.

The insulation 50 is engaged around the clip 64 of the center contact.

The cable 40 fitted with the center contact 51 carrying the insulation 50 is engaged into the outer conductor 49 from the rear, the metal braid of the cable 40 being pressed against the outer wall of the rear portion 52 of the outer contact 49.

The sleeve 71 is moved forwards to cover the ground braid of the cable and to lock it on the rear portion 52 of the outer contact 49.

The assembly is inserted into the rear of the through portion 72 of the housing.

The split ring 74 is put into place around the cylindrical segment 78 of the outer contact via the chimney 75 of the through portion 72 of the housing.

The assembly is snap-fastened in the fixing portion 76 of the housing.

It can be seen that the device as described above is simple and of low cost, both concerning its component parts and concerning assembly on the end of a coaxial cable.

Furthermore, as already mentioned, the device of the invention is advantageous in that it requires no special preparation of the printed circuit card.

Naturally, the embodiments described above are not limiting in any way and could receive any desirable modification without thereby going beyond the ambit of the invention as defined by the claims.

In particular, the coaxial line for connection to the printed circuit card by means of the device of the invention could be constituted by any medium, and is not limited to a coaxial cable.

Furthermore, the conductor tracks on the card can be arranged differently, e.g. having only one ribbon on one face in register with the center contact to carry the signal, and a complete ground plane on the other face, with a notch for receiving the bearing zone of the center contact.

What is claimed is:

1. A device for electrically connecting a coaxial line to a printed circuit card having at least two conductor tracks each extending to the edge of said card, the device comprising an outer contact and a center contact housed inside the outer contact, wherein the outer contact has a substantially tubular connection portion for connection to the card, said connection portion having two diametrically-opposite slots subdividing it into two jaws arranged to pinch between them said card inserted via its edge between said jaws, with the first edge of each jaw bearing on the card, and wherein the center contact comprises a clip-forming connection portion comprising two spring blades for connection to the card, with the edge of the card engaging therein when the card is inserted between the two jaws of the outer contact.

2. A device according to claim 1, wherein the outer contact of the device is made on a lathe.

3. A device according to claim 1, wherein the outer contact is made by cutting and rolling a metal sheet.

4. A device according to claim 1, wherein the center contact is made by cutting, rolling, and/or folding a metal sheet.

5. A device according to claim 1, the device being arranged to be mounted on a panel adjacent to the printed circuit card, in such a manner that said panel supports the device and releases its connection portion mounted on the edge of the card from the mechanical stresses that result from the presence of a coaxial cable.

* * * * *